United States Patent [19]
Slemmer

[11] Patent Number: 5,321,314
[45] Date of Patent: Jun. 14, 1994

[54] SIGNAL LINE PULSE ENHANCING CIRCUIT FOR INTEGRATED CIRCUITS

[75] Inventor: William C. Slemmer, Dallas, Tex.

[73] Assignee: SGS-Thomson Microelectronics, Inc., Carrollton, Tex.

[21] Appl. No.: 109,697

[22] Filed: Aug. 20, 1993

Related U.S. Application Data

[63] Continuation of Ser. No. 823,680, Jan. 21, 1992, abandoned.

[51] Int. Cl.$^5$ .................... H03K 5/12; H03K 5/01
[52] U.S. Cl. ..................... 307/263; 307/264; 307/265; 307/268; 307/603; 307/606
[58] Field of Search ............... 307/263-268, 307/602, 603, 606

[56] References Cited
U.S. PATENT DOCUMENTS

| | | | |
|---|---|---|---|
| 4,553,042 | 11/1985 | Batterman | 307/263 |
| 4,710,653 | 12/1987 | Yee | 307/603 |
| 4,825,101 | 4/1989 | Walters, Jr. | 307/263 |
| 4,880,997 | 11/1989 | Steele | 307/264 |
| 4,947,133 | 8/1990 | Thomas | 307/264 |
| 5,047,673 | 9/1991 | Kaneko | 307/481 |
| 5,059,834 | 10/1991 | Tago et al. | 307/480 |
| 5,072,131 | 12/1991 | Nakano | 307/360 |
| 5,128,555 | 7/1992 | Millman | 307/263 |

*Primary Examiner*—Margaret Rose Wambach
*Attorney, Agent, or Firm*—Kenneth C. Hill; Lisa K. Jorgenson; Richard K. Robinson

[57] ABSTRACT

According to the present invention, a first circuit is used to detect a positive voltage transition on a signal line. A second circuit is used to detect a negative voltage transition on the signal line. Upon detecting a transition, the first circuit will drive the signal line high. The second circuit pulls the line to ground after sensing a negative voltage transition. A delay circuit determines the time period in which the first or second circuit is connected to the signal line.

12 Claims, 2 Drawing Sheets

SIGNAL LINE PULSE ENHANCING CIRCUIT FOR INTEGRATED CIRCUITS

This is a continuation of application Ser. No. 07/823,680, filed Jan. 21, 1991, now abandoned.

BACKGROUND OF THE INVENTION

1. Field of the Invention

The present invention relates generally to integrated circuit devices, and more specifically to enhancing a signal on a long line or distributed line within the integrated circuit.

2. Description of the Prior Art

In the drive to increase miniaturization on integrated circuits, signal lines are made longer and thinner. This change in signal line geometry has increased the resistance and capacitance on these signal lines. This increase in resistance and capacitance results in the slowing down and degradation of signals sent on the lines. Consequently, sending a signal from one end of the chip to the other has become a limitation on the performance of the circuits.

To improve the signals sent on long or distributed lines in an integrated circuit, a series of inverters are typically added at the midpoint of the line. These series of inverters are known in the art as repeaters. The use of repeaters generally results in reducing the degradation of a signal sent on a long or a distributed line. The repeaters, however, also have the undesirable affect of significantly delaying the signal.

Therefore, it would be desirable to provide a method for eliminating the degradation of a signal sent on a long or a distributed line, without significantly delaying the signal.

SUMMARY OF THE INVENTION

It is therefore an object of the present invention to provide a method for sending a signal down a long or distributed line in an integrated circuit without any degradation of that signal.

It is another object of the present invention to provide such a method for sending a signal down a long or distributed line without significantly delaying the signal.

It is another object of the present invention to provide such a method and structure which is compatible with standard process flows, and which add minimal additional complexity to the fabrication of a typical integrated circuit.

Therefore, according to the present invention, a first circuit is used to detect a positive voltage transition on a signal line. A second circuit is used to detect a negative voltage transition on the signal line. Upon detecting a transition, the first circuit will drive the signal line high. The second circuit pulls the line to ground after sensing a negative voltage transition. A delay circuit determines the time period in which the first or second circuit is connected to the signal line.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1A:
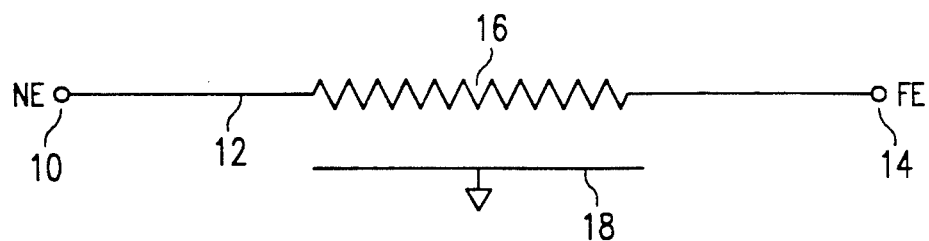
FIG. 1a is a simplified circuit diagram of a long or distributed line in an integrated circuit.

FIG. 1a presents a simplified circuit diagram which illustrates the problem with a long signal line in an integrated circuit. The near end (NE) 10 of the signal line 12 is the driver end of a long line. The far end (FE) 14 of the signal line 12 lies at a point near the end of a long line. Resistor 16 and capacitor 18 represent the resistance and capacitance which result from the length of the signal line 12.

Figure 1B:
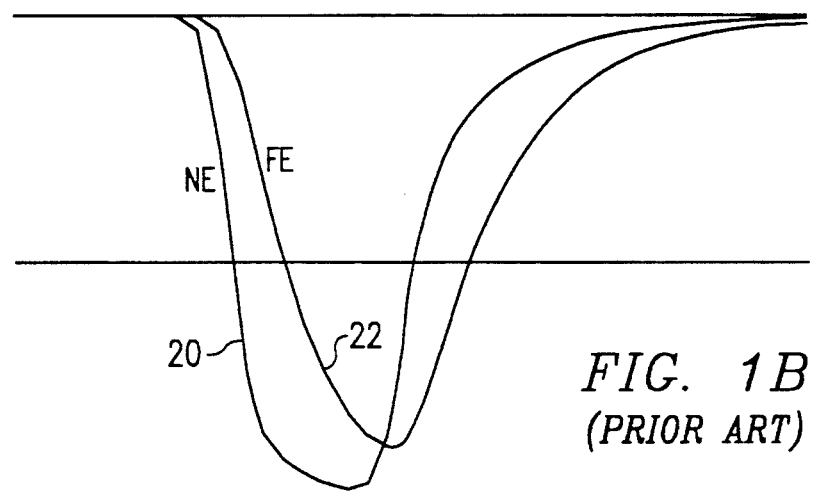
FIG. 1b is a graph depicting a signal before and after it is sent on a long or distributed line in an integrated circuit.

The graph in FIG. 1b depicts the waveform of a signal sent down the signal line 12. The waveform 20 marked NE represents a pulse signal at the near end 10 of signal line 12. The waveform 22 marked FE represents the signal at the far end 14 of signal line 12. As can be seen, waveform 22 representing the signal at the far end 14 of the signal line 12 is delayed in time and is substantially degraded.

Figure 2:
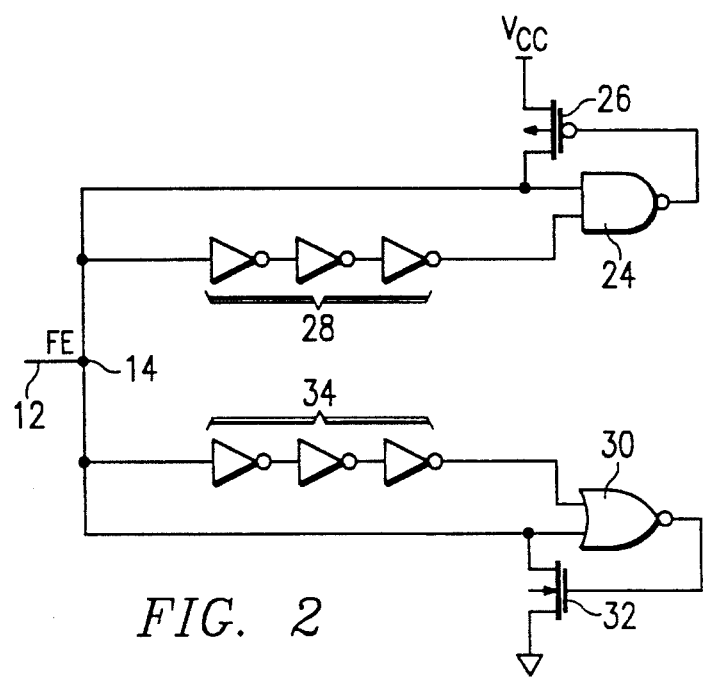
FIG. 2 is a block diagram of a logic circuit for enhancing a signal on a long line in an integrated circuit according to the present invention.

Referring to FIG. 2, a block diagram of a logic circuit for enhancing a signal on a long signal line is shown. In this circuit, the NAND gate 24 detects a positive voltage transition in the signal and generates a negative pulse at the gate of transistor 26. This pulls the signal line 12 to high at the far end 14. A series of inverters 28 is used to set the width of the negative pulse. Once the pulse passes through the inverters, transistor 26 is turned off.

The NOR gate 30 detects a negative voltage transition in the signal and generates a positive pulse at the gate of transistor 32. This pulls the signal line 12 to ground at the far end 14. Again, a series of inverters 34 is used to set the width of the positive pulse, and once the pulse passes through the inverters, transistor 32 is turned off.

Figure 3:
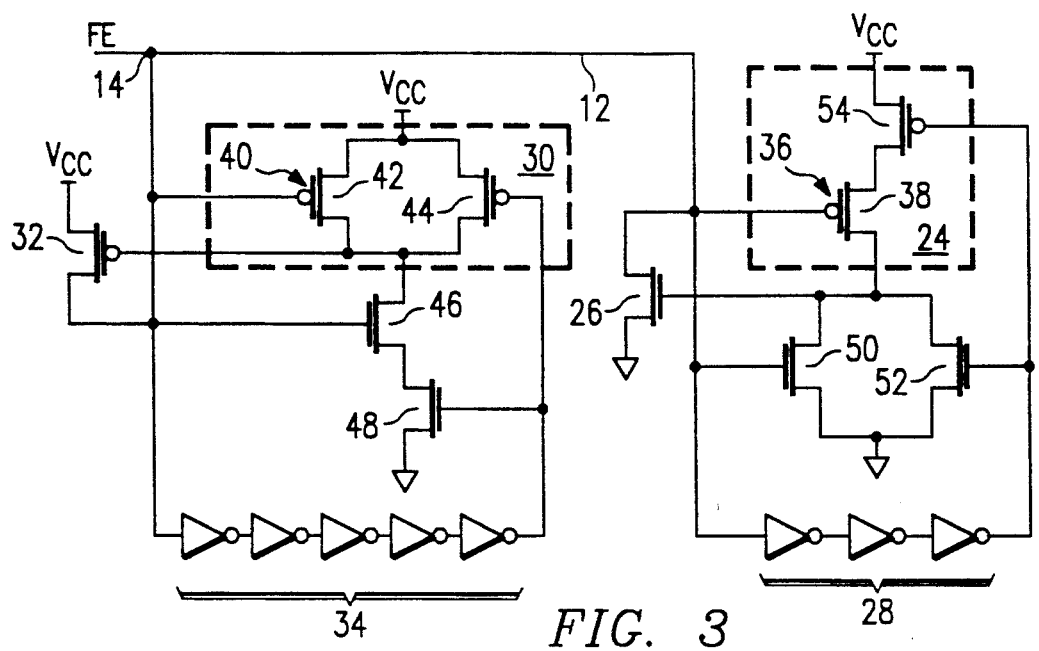
FIG. 3 is a circuit diagram of a logic circuit for enhancing a signal on a long or distributed line in an integrated circuit according to the present invention.

FIG. 3 illustrates a detailed circuit diagram implementing the present invention. The trigger voltage levels of input 36 of transistor 38 in NAND gate 24 and input 40 of transistor 42 of NOR gate 30 can be set to detect the early portions of their respective transitions. The trigger voltages are determined by the size ratios of transistors 38, 42, 46, 48, 50 and 54 used in the circuit.

Figure 4:
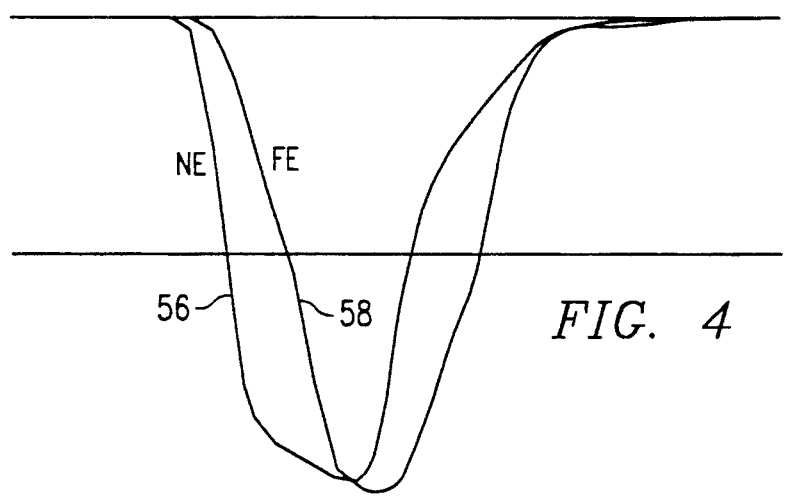
FIG. 4 is a graph depicting a signal before and after it is sent on a long or distributed line according to the present invention.

The graph in FIG. 4 depicts the waveforms of an enhanced signal sent down the signal line 12. Again, the waveform 56 marked NE represents the signal at the near end 10 of the signal line 12. Waveform 58 marked FE represents the signal at the far end 14 of the signal line 12. As can be seen, waveform 58 representing the signal at the far end 14 of the signal line 12 mirrors waveform 56. Waveform 58 does not show any degradation and the pulse attains the voltage level of waveform 56. Furthermore, waveform 58 reaches the voltage level of waveform 56 faster than it would without the pulse enhancing circuit.

Although the description of the invention has focused on using the pulse enhancing circuit at the far end of a long line, the circuit can be used for other reasons and at other locations than described above. For example the circuit could be placed at the middle of a long signal line. It is also possible to use several pulse enhancing circuits placed at multiple locations along a long signal line.

Figure 5:
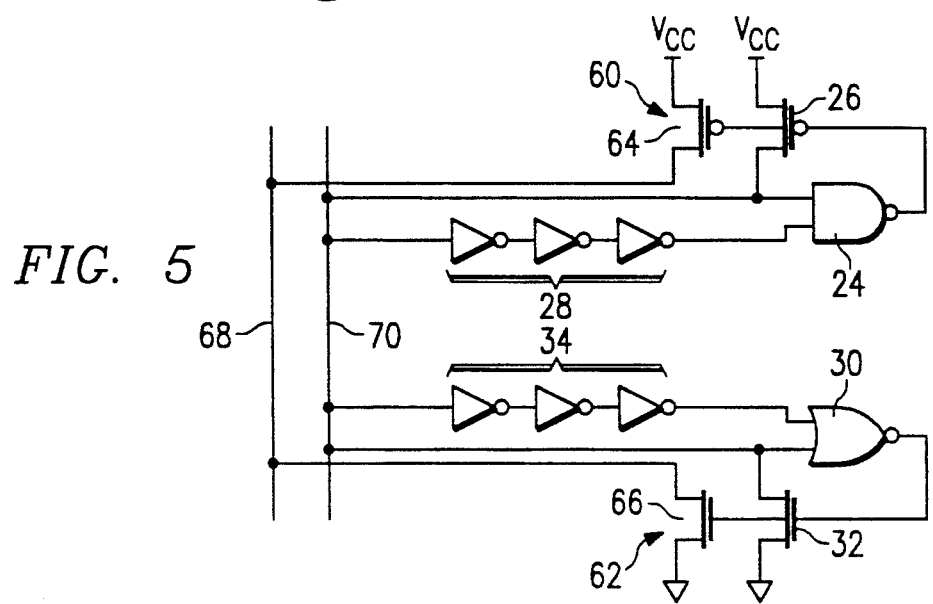
FIG. 5 is a block diagram of a logic circuit for enhancing a signal on a distributed line according to the present invention.

In some situations a signal line needs to run the length of an integrated circuit and drive a distributed load. The distributed load has the undesirable effect of creating a severe resistance and capacitance loading problem on the signal line. The signal on the distributed load line can be enhanced by using the circuitry of the present invention combined with a parallel signal line with lower resistance and capacitance. This arrangement is illustrated in FIG. 5.

The circuitry of the pulse enhancing circuit is as described in conjunction with FIG. 2, with the addition of transistors 60, 62. The drains 64, 66 of transistors 60, 62 are connected to the distributed load line 68. The parallel signal line 70 is connected to the series of inverters 28, 34 and the input to the NAND gate 24 and NOR gate 30. When the NAND gate 24 generates a negative pulse, transistor 60 pulls the distributed load line 68 high. When the NOR gate 30 generates a positive pulse, transistor 62 pulls the distributed load line 68 to ground. As described earlier, the series of inverters 28 determine the width of the negative pulse. The series of inverters 34 determine the width of the positive pulse.

Using the pulse enhancing circuit in combination with the parallel signal line 70 boosts the signal on the distributed load line 68. This causes the signal on the distributed load line 68 to reach its peak faster and without any degradation.

While the invention has been particularly shown and described with reference to a preferred embodiment, it will be understood by those skilled in the art that various changes in form and detail may be made therein without departing from the spirit and scope of the invention.

What is claimed is:

1. A circuit for enhancing a signal on a signal line, the signal line having a near end and a far end, the circuit comprising:
   a p-channel transistor having a source connected to a positive voltage supply, and a drain connected to the signal line far end;
   a first logic gate having an output connected to a gate of the p-channel transistor, and having a first input connected to the signal line far end;
   a first delay circuit having an input connected to the signal line far end, and having an output connected to a second input of the first logic gate;
   an n-channel transistor having a source connected to a negative voltage supply, and a drain connected to the signal line far end;
   a second logic gate having an output connected to a grate of the n-channel transistor, and having a first input connected to the signal line far end; and
   a second delay circuit having an input connected to the signal line far end, and having an output connected to a second input of the second logic gate;
   wherein the first logic gate operates to turn on the p-channel transistor when a voltage at the signal line far end rises above a first threshold voltage, for a time period determined by the first delay circuit;
   and wherein the second logic gate operates to turn on the n-channel transistor when a voltage at the signal line far end falls below a second threshold voltage, for a time period determined by the second delay circuit.

2. The circuit of claim 1, wherein the first logic gate comprises a NAND gate, and the second logic gate comprises a NOR gate.

3. The circuit of claim 2, wherein the first and second delay circuits each comprises an odd number of inverters in series.

4. The circuit of claim 3, wherein the first and second delay circuits each comprise three inverters in series.

5. The circuit of claim 3, wherein the first and second delay circuits each have the same number of inverter stages.

6. The circuit of claim 1, wherein the first input of the first logic gate has a threshold voltage which is lower than a threshold of the first input of the second logic gate.

7. The circuit of claim 1, further comprising:
   a second signal line having a first end adjacent the near end and a second end adjacent the far end;
   a second p-channel transistor having a source connected to the positive voltage supply, a drain connected to the second end, and a gate connected to the first logic gate output; and
   a second n-channel transistor having a source connected to the negative voltage supply, a drain connected to the second end, and a gate connected to the second logic gate output.

8. The circuit of claim 7, wherein the first logic gate comprises a NAND gate, and the second logic gate comprises a NOR gate.

9. The circuit of claim 8, wherein the first and second delay circuits each comprise an odd number of inverters in series.

10. The circuit of claim 9, wherein the first and second delay circuits each comprise three inverters in series.

11. The circuit of claim 9, wherein the first and second delay circuits each have the same number of inverter stages.

12. The circuit of claim 7, wherein the first input of the first logic gate has a threshold voltage which is lower than a threshold of the first input of the second logic gate.

* * * * *